US008421736B2

(12) United States Patent
Park

(10) Patent No.: US 8,421,736 B2
(45) Date of Patent: Apr. 16, 2013

(54) BI-DIRECTIONAL DRIVING CIRCUIT OF LIQUID CRYSTAL DISPLAY PANEL

(75) Inventor: Jae Deok Park, Kyongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 1301 days.

(21) Appl. No.: 11/580,147

(22) Filed: Oct. 13, 2006

(65) Prior Publication Data

US 2007/0242018 A1 Oct. 18, 2007

Related U.S. Application Data

(62) Division of application No. 10/082,125, filed on Feb. 26, 2002, now Pat. No. 7,136,041.

(30) Foreign Application Priority Data

Feb. 27, 2001 (KR) .......................... 10-2001-009965

(51) Int. Cl.
*G09G 3/36* (2006.01)
(52) U.S. Cl.
USPC ........................................... 345/100; 345/92
(58) Field of Classification Search ............ 345/87–111
See application file for complete search history.

(56) References Cited

U.S. PATENT DOCUMENTS 5,859,630 A * 1/1999 Huq ............................ 345/100

FOREIGN PATENT DOCUMENTS

JP 10-074060 3/1998

* cited by examiner

*Primary Examiner* — Srilakshmi K Kumar
(74) *Attorney, Agent, or Firm* — McKenna Long & Aldridge, LLP

(57) ABSTRACT

A bi-directional driving circuit of a liquid crystal display (LCD) panel is disclosed, in which forward scanning and backward scanning are available. In a bi-directional driving circuit of an LCD panel having a plurality of blocks, each block includes a first start pulse input terminal to which a start pulse or an output signal of a previous block is input and a second start pulse input terminal to which the start pulse or an output signal of a next block is input. Also, each block includes a first switching portion switching a start pulse signal applied to an input terminal of a first block among the blocks and switching an output signal of a previous block, which is applied to input terminals of the other blocks and a second switching portion switching a start pulse signal applied to an input terminal of the last block and switching an output signal of a previous block, which is applied to input terminals of the other blocks.

1 Claim, 9 Drawing Sheets

_US 8,421,736 B2_

BI-DIRECTIONAL DRIVING CIRCUIT OF LIQUID CRYSTAL DISPLAY PANEL

This application is a Divisional of prior application Ser. No. 10/082,125, filed Feb. 26, 2002, now U.S. Pat. No. 7,136,041, which claims the benefit of Korean Patent Application No. 9965/2001 filed in Korea on Feb. 27, 2001, each of which are hereby incorporated by reference in their entirety as if fully set forth herein.

BACKGROUND OF THE INVENTION

1. Field of the Invention

The present invention relates to a bi-directional driving circuit of a liquid crystal display (LCD) panel, particularly, to a bi-directional driving circuit of an LCD panel that enables bi-directional driving.

2. Background of the Related Art

A typical LCD device includes a driving circuit in an LCD panel, such as a gate driving integrated circuit (IC) and a data driving IC. Also, the LCD device has a fixed driving direction. However, system makers sometimes require various panel configurations.

FIG. 1 is a circuit diagram illustrating a typical polysilicon thin film transistor (TFT) LCD panel.

Referring to FIG. 1, the polysilicon TFT LCD panel includes a pixel array having a plurality of gate lines Gi to Gm arranged to cross a plurality of data lines D1 to Dn, a plurality of first shift registers 11 and buffers 12 for supplying scan signals to each gate line. A plurality of second shift registers 13 and buffers 14 are respectively located in each block of k blocks 2 divided from each data line. The LCD panel also includes a plurality of signal lines S1 to Sn for transmitting video signals output from a digital-to-analog converter (not shown) of a data driving circuit (not shown) to each data line, and a plurality of switching elements 16 for sequentially applying video signals of the signal lines S1 to Sn to the data lines per each block by driving signals output from the second shift registers 13 and buffers 14.

In the driving circuit of the polysilicon LCD panel unlike a conventional amorphous silicon circuit, to reduce the number of contact lines between an external circuit and a panel, the data lines are divided into m blocks while the gate lines are selected, so that a display voltage is sequentially supplied to the data lines. Therefore, the gate lines and the data lines are sequentially driven by the shift registers to display picture images. In this case, since the shift registers implement shifting only in a fixed direction, the degree of freedom in a driving direction required by system makers cannot be provided.

A shift register of the related art LCD panel will be described with reference to FIG. 2.

FIG. 2 is a circuit diagram of a shift register of the related art LCD panel.

A gate pulse or data start pulse (VST), four clock signals CLK1, CLK2, CLK3, and CLK4 having different phases, a power source voltage Vdd and a ground voltage Vss are input to an input terminal of the shift register.

The circuit structure of the shift register includes eight blocks having a similar structure except for a portion where a clock signal is applied.

The first block includes a first p-MOS transistor TFT1 having a source and a gate to which the start pulse VST is applied. Also, a second p-MOS transistor TFT2 having a source is connected to a drain of the first p-MOS transistor TFT1 and a gate to which the fourth clock signal CLK4 is applied. The third p-MOS transistor TFT3 has a source connected to a drain of the second p-MOS transistor TFT2 and a drain connected to the Vss terminal. The fourth p-MOS transistor TFT4 has a source connected to the Vdd terminal, a gate connected to the third clock signal CLK3, and a source connected to the drain of the fourth p-MOS transistor TFT4. The sixth p-MOS transistor TFT6 has a source connected to the first clock signal CLK1, a gate connected to the drain of the second p-MOS transistor TFT2, and a drain connected to the output terminal. The seventh p-MOS transistor TFT7 has a source connected to the output terminal, a gate connected to the drain of the fourth p-MOS transistor TFT4, and a drain connected to the Vss terminal.

A contact node between the drain of the second p-MOS transistor TFT2 and the source of the third p-MOS transistor TFT3 is grounded through a capacitor C1. The gate of the sixth p-MOS transistor TFT6 is connected to the Vss terminal through a second capacitor C2. The gate and the drain of the sixth p-MOS transistor TFT6 are connected with each other through a third capacitor C3. The gate of the seventh p-MOS transistor TFT7 is connected to the Vss terminal through a fourth capacitor C4.

The respective first to eighth blocks are different in that different clock signals are applied to the source of the sixth p-MOS transistor TFT6, the gate of the fourth p-MOS transistor TFT4, and the gate of the second p-MOS transistor TFT2. Also, to the source and the gate of the first p-MOS transistor TFT1 an output terminal of a previous block is connected.

The clock signals from the first block to the eighth block are connected as follows.

The clock signals applied to the source of the sixth p-MOS transistor TFT6 are connected as follows.

The first clock signal CLK1 is applied to the source of the sixth p-MOS transistor TFT6 in the first and the fifth block. The second clock signal CLK2 is applied to the source of the sixth p-MOS transistor TFT6 in the second block and the sixth block. The third clock signal CLK3 is applied to the source of TFT6 in the third block and the seventh block. The fourth clock signal CLK4 is applied to the source of TFT6 in the fourth block and the eighth block.

In blocks one through eight, different clock signals are applied to the gate of the fourth p-MOS transistor TFT4 and are connected as follows.

In the first and fifth blocks, the third clock signal CLK3 is applied to the gate of the fourth p-MOS transistor TFT4. In the second and sixth block, the fourth clock signal CLK4 is applied to the gate of the fourth p-MOS transistor TFT4. In the third and seventh blocks, the first clock signal CLK1 is applied to the gate of the fourth p-MOS transistor TFT4. In the fourth and eight blocks, the second clock signal CLK2 is applied to the gate of the fourth p-MOS transistor TFT4.

In blocks one through eight, different clock signals are applied to the gate of the second p-MOS transistor TFT2 and are connected as follows.

In the first and fifth blocks, the fourth clock signal CLK4 is applied to the gate of the second p-MOS transistor TFT2. In the second and sixth blocks, the first clock signal CLK1 is applied to the gate of the second p-MOS transistor TFT2. In the third and seventh blocks, the second clock signal CLK2 is applied to the gate of the second p-MOS transistor TFT2. In the fourth and eight blocks, the third clock signal CLK3 is applied to the gate of the second p-MOS transistor TFT2.

The operation of the aforementioned level shifter of the related art LCD panel will be described with reference to FIG. 3.

FIG. 3 illustrates input and output waveforms of the shift register of the related art LCD panel.

First, the operation of the first block will be described.

The first p-MOS transistor TFT1 is turned on when a low level start pulse VST is input in a switch-on state. At this time, since the fourth clock signal CLK4 is input in a switch on state, the second p-MOS transistor TFT2 is also turned on. Accordingly, the node Q becomes low level in a switch on state. This turns on the sixth p-MOS transistor TFT6. As a result, the first clock signal CLK1 is output to the output terminal. In addition, because node QB is high in a switch off state, the seventh p-MOS transistor TFT7 is turned off. As a result, the ground voltage Vss is not applied to the output terminal.

Likewise, in the second block, the output of the first block is low and the first clock signal is low. As a result, the second clock signal CLK2 applied to the source of the sixth p-MOS which was turned on by the Q node and as a result is output through the sixth transistor TFT6.

As shown in FIG. 3, the outputs are sequentially generated from the first block to the eighth block.

However, the related art LCD panel having the driving circuit has several problems.

For example, problems arise in that picture images can be scanned only in an originally designed direction. In other words, the output fails to be generated in the order of the last block to the first block. In this case, it is difficult to freely set a direction of the LCD panel, for example, a landscape or portrait type orientation. Because the system manufacturers who make the products that have LCD panels want a display device capable of scanning images in more than one direction, this is a serious limitation of the related art LCD panels.

SUMMARY OF THE INVENTION

The present invention is directed to a bi-directional driving circuit of a liquid crystal display (LCD) panel that substantially obviates one or more problems due to limitations and disadvantages of the related art.

An advantage of the present invention is to provide a bi-directional driving circuit of an LCD panel in which forward scanning and backward scanning are available without requiring a separate input pad.

Additional advantages, features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, in a bi-directional driving circuit of an LCD panel having a plurality of blocks, each block includes a first start pulse input terminal to which a start pulse or an output signal of a previous block is input; and a second start pulse input terminal to which the start pulse or an output signal of a next block is input.

To further achieve these and other advantages, in a bi-directional driving circuit of an LCD panel having a plurality of blocks, each block outputting a signal, the bi-directional driving circuit includes a first switching portion for switching a start pulse signal applied to an input terminal of a first block among the blocks, and for switching an output signal of a previous block, which is applied to input terminals of the other blocks; and a second switching portion for switching a start pulse signal applied to an input terminal of the last block, and for switching an output signal of a previous block, which is applied to input terminals of the other blocks.

To further achieve these objects and other advantages, in a bi-directional driving circuit of an LCD panel having a plurality of blocks, each block includes a first switching element having a source and a gate to which a start pulse is applied; a second switching element having a source connected to a drain of the first switching element and a gate to which a first clock signal is applied; a third switching element having a source connected to a drain of the second switching element and a drain connected to a ground terminal Vss; a fourth switching element having a source connected to a power source voltage terminal Vdd, a gate connected to a second clock signal, and a drain connected to a gate of the third switching element; a fifth switching element having a source connected to the drain of the fourth switching element, a gate connected to the drain of the first switching element, and a drain connected to the Vss terminal; a sixth switching element having a source connected to the second clock signal, a gate connected to the drain of the second switching element, and a drain connected to an output terminal; a seventh switching element having a source connected to the output terminal, a gate connected to the drain of the fourth switching element, and a drain connected to the Vss terminal; an eighth switching element having a source and a gate connected to an output terminal of a next block and a drain connected to the drain of the first switching element; and a ninth switching element connected to the second switching element in parallel, having a gate connected to the second clock signal.

Each block further possibly includes a first capacitor connected between a contact node between the drain of the second switching element and the source of the third switching element and the ground terminal; a second capacitor connected between the gate of the sixth switching element and the Vss terminal; a third capacitor connected between the gate of the sixth switching element and its drain; and a fourth capacitor connected between the gate of the seventh switching element and the Vss terminal.

The blocks possibly include first to eighth blocks, wherein the first clock signal is applied to the source of the sixth switching element in the first and fifth blocks; the second clock signal in the second and sixth blocks; a third clock signal in the third and seventh blocks; and a fourth clock signal in the fourth and eighth blocks. The third clock signal is applied to the gate of the fourth switching element in the first and fifth blocks; the fourth clock signal in the second and sixth blocks; the first clock signal in the third and seventh blocks; and the second clock signal in the fourth and eighth blocks. The fourth clock signal is applied to the gate of the second switching element in the first and fifth blocks; the first clock signal in the second and sixth blocks; the second clock signal in the third and seventh blocks; and the third clock signal in the fourth and eighth blocks. The second clock signal is applied to the gate of the ninth switching element in the first and fifth blocks; the third clock signal in the second and sixth blocks; the fourth clock signal in the third and seventh blocks; and the first clock signal in the fourth and eighth blocks.

An output signal of a previous block is possibly applied to the gate and the source of the first switching element as a start pulse signal in the other blocks, except for the first block, and the start pulse signal is applied to the eighth switching element of the last block.

The gate of the fifth switching element is possibly connected to the drain terminal of the second switching element or the ninth switching element.

Each block further possibly includes a tenth switching element connected between the first switching element and the second switching element, for being switched depending on a gate voltage of the second switching element; and an eleventh switching element connected between the eighth switching element and the second switching element, for being switched depending on a gate voltage of the ninth switching element.

Each block further possibly includes first and second capacitors respectively connected between contact nodes and the ground terminal, the contact nodes being arranged between the first and tenth switching elements and between the tenth and second switching elements; a third capacitor connected between a contact node arranged between the eight and eleventh switching elements and the ground terminal; a fourth capacitor connected between the gate of the sixth switching element and the Vss terminal; a fifth capacitor connected between the gate and the drain of the sixth switching element; and a sixth capacitor connected between the gate of the seventh switching element and the Vss terminal.

The respective switching elements possibly are p-MOS transistors.

To further achieve these and other advantages, in a bi-directional driving circuit of an LCD panel having a plurality of blocks, each block includes a first switching element having a source and a gate to which a start pulse is applied; a third switching element having a source connected to a drain of the first switching element and a drain connected to a ground Vss terminal; a fourth switching element having a source connected to a power source Vdd terminal, a gate connected to a first clock signal, and a drain connected to a gate of the third switching element; a fifth switching element having a source connected to the drain of the fourth switching element, a gate connected to the source of the first switching element, and a drain connected to the Vss terminal; a sixth switching element having a source connected to a second clock signal, a gate connected to the drain of the first switching element, and a drain connected to an output terminal; a seventh switching element having a source connected to the output terminal, a gate connected to the drain of the fourth switching element, and a drain connected to the Vss terminal; a plurality of eighth p-MOS transistors switching the start pulse VST applied to the gate and the source of the first p-MOS transistor TFT1 in the first block, and switching an output signal applied to the gate and the source of the first p-MOS transistor TFT1 in a next block, through an external forward control signal; and a plurality of ninth p-MOS transistors TFT9 switching the start pulse VST applied to the gate and the source of the first p-MOS transistor TFT1 in the last block, and switching an output signal applied to the gate and the source of the first p-MOS transistor TFT1 in a previous block, through an external backward control signal.

Each block possibly further includes a first capacitor connected between a contact node arranged between the first and third switching elements and a ground terminal Vss; a second capacitor connected between the gate of the sixth switching element and the ground terminal; a third capacitor connected between the gate of the sixth switching element and its drain; and a fourth capacitor connected between the gate of the seventh switching element and the ground terminal Vss.

The blocks possibly include first to eighth blocks, wherein the first clock signal is applied to the source of the sixth switching element in the first and fifth blocks; the second clock signal in the second and sixth blocks; a third clock signal in the third and seventh blocks; and a fourth clock signal in the fourth and eighth blocks. The third clock signal is applied to the gate of the fourth switching element in the first and fifth blocks; the fourth clock signal in the second and sixth blocks; the first clock signal in the third and seventh blocks; and the second clock signal in the fourth and eighth blocks.

Each block possibly further includes a second switching element connected between the first and third switching elements, for being switched by another clock signal.

The fourth clock signal possibly is applied to the gate of the second switching element in the first and fifth blocks; the first clock signal in the second and sixth blocks; the second clock signal in the third and seventh blocks; and the third clock signal in the fourth and eighth blocks.

An output signal of a previous block possibly is applied to the gate and the source of the first switching element as a start pulse signal through the eighth switching element in the blocks except for the first block, and an output signal of a next block is applied to the gate and the source of the first switching element as a start pulse signal through the ninth switching element in the blocks except for the last block.

The respective switching elements are possibly p-MOS transistors.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to the illustrated embodiments of the present invention, examples of which are illustrated in the accompanying drawings.

Figure 4:
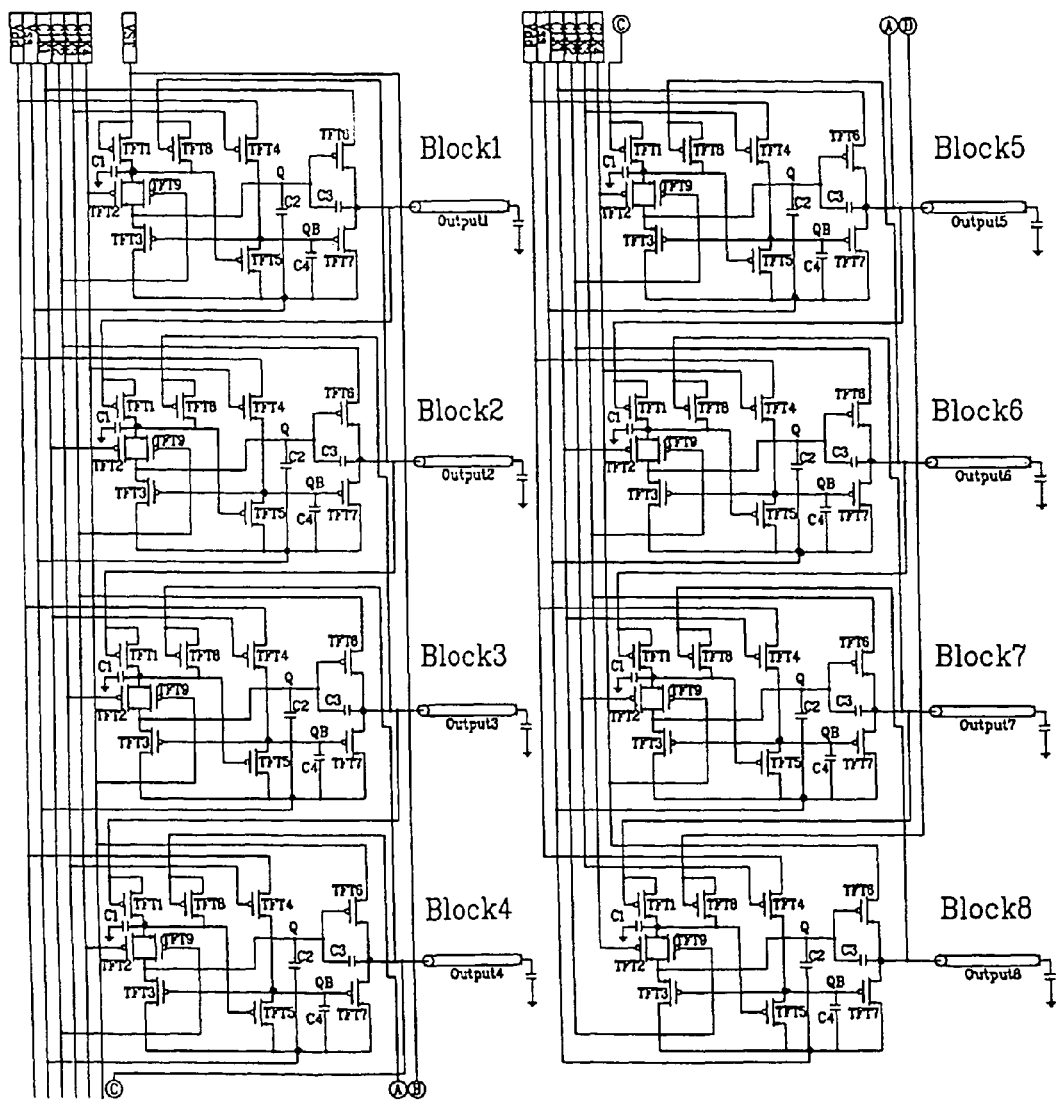
FIG. 4 is a circuit diagram of a shift register of an LCD panel according to a first embodiment of the present invention.

A bi-directional driving circuit, commonly called a shift register, of a liquid crystal display (LCD) panel according to the present invention will be described with reference to FIG. 4.

First, in the same manner as the related art, a gate pulse or data start pulse (VST), four clock signals CLK1, CLK2, CLK3, and CLK4 having different phases, a power source voltage Vdd, and a ground voltage Vss are input via an input terminal of a shift register.

A circuit structure of the shift register includes first to eighth blocks having a similar structure except for portions where clock signals are applied.

The first block includes a first p-MOS transistor TFT1 having a source and a gate to which the start pulse VST is applied; a second p-MOS transistor TFT2 having a source connected to a drain of the first p-MOS transistor TFT1 and a gate to which the fourth clock signal CLK4 is applied; a third p-MOS transistor TFT3 having a source connected to a drain of the second p-MOS transistor TFT2 and a drain connected to the Vss terminal; a fourth p-MOS transistor TFT4 having a source connected to the Vdd terminal, a gate connected to the third clock signal CLK3, and a drain connected to a gate of the third p-MOS transistor TFT3; a fifth p-MOS transistor TFT5 having a source connected to a drain of the fourth p-MOS transistor TFT4, and a gate connected to the drain of the first p-MOS transistor TFT1, and a drain connected to the Vss terminal; a sixth p-MOS transistor TFT6 having a source connected to the first clock signal CLK1, a gate connected to the drain of the second p-MOS transistor TFT2, and a drain connected to the output terminal; a seventh p-MOS transistor TFT7 having a source connected to the output terminal, a gate connected to the drain of the fourth p-MOS transistor TFT4, and a drain connected to the Vss terminal, an eighth p-MOS transistor TFT8 having a source and a gate connected to an output terminal of the next block and a drain connected to the drain of the first p-MOS transistor TFT1; and a ninth p-MOS transistor TFT9 connected to the second p-MOS transistor TFT2 in parallel, having a gate connected to the second clock signal.

A first capacitor C1 is connected between the drain of the first p-MOS transistor TFT1 and the Vss terminal. The gate of the sixth p-MOS transistor TFT6 is connected to the Vss terminal through a second capacitor C2 and the gate and drain of TFT6 are connected with each other through a third capacitor C3. The gate of the seventh p-MOS transistor TFT7 is connected to the Vss terminal through a fourth capacitor C4.

The first to eighth blocks are different in that different clock signals are applied to the source of the sixth p-MOS transistor TFT6, the gate of the fourth p-MOS transistor TFT4, and the gate of the second p-MOS transistor TFT2. An output terminal of a previous block is connected to the source and the gate of the first p-MOS transistor TFT1. For example, in block 2 Output1 from block 1 is connected to the source and the gate of first p-MOS transistor TFT1. In the last block a start pulse VST is connected to the source and the gate of the eighth p-MOS transistor TFT8, and the eight p-MOS transistor TFT8 is connected to an output terminal of the next block.

The clock signals in the first block to the eighth block are connected as follows.

The clock signals applied to the source of the sixth p-MOS transistor TFT6 are connected as follows.

The first clock signal CLK1 is applied to the source of the sixth p-MOS transistor TFT6 in the first and fifth blocks. The second clock signal CLK2 is applied to the source of the sixth p-MOS transistor TFT6 in the second and sixth blocks. The third clock signal CLK3 is applied to the source of the sixth p-MOS transistor TFT6 in the third and seventh blocks. The fourth clock signal CLK4 is applied to the source of the sixth p-MOS transistor TFT6 in the fourth and eighth blocks.

The clock signals applied to the gate of the fourth p-MOS transistor TFT4 are connected as follows.

The third clock signal CLK3 is applied to the gate of the fourth p-MOS transistor TFT4 in the first and fifth blocks. The fourth clock signal CLK4 is applied to the gate of the fourth p-MOS transistor TFT4 in the second and sixth blocks. The first clock signal CLK1 is applied to the gate of the fourth p-MOS transistor TFT4 in the third and seventh blocks. The second clock signal CLK2 is applied to the gate of the fourth p-MOS transistor TFT4 in the fourth and eighth blocks.

The clock signals applied to the gate of the second p-MOS transistor TFT2 are connected as follows.

The fourth clock signal CLK4 is applied to the gate of the second p-MOS transistor TFT2 in the first and fifth blocks. The first clock signal CLK1 is applied to the gate of the second p-MOS transistor TFT2 in the second and sixth blocks. The second clock signal CLK2 is applied to the gate of the second p-MOS transistor TFT2 in the third and seventh blocks. The third clock signal CLK3 is applied to the gate of the second p-MOS transistor TFT2 in the fourth and eighth blocks.

The clock signals applied to the gate of the ninth p-MOS transistor TFT9 are connected as follows.

The second clock signal CLK2 is applied to the gate of the ninth p-MOS transistor TFT9 in the first and fifth blocks. The third clock signal CLK3 is applied to the gate of the ninth p-MOS transistor TFT9 in the second and sixth blocks. The fourth clock signal CLK4 is applied to the gate of the ninth p-MOS transistor TFT9 in the third and seventh blocks. The first clock signal CLK1 is applied to the gate of the ninth p-MOS transistor TFT9 in the fourth and eighth blocks.

The operation of the aforementioned bi-directional shift register of the LCD panel according to the first embodiment of the present invention will be described with reference to FIG. 5.

Figure 5:
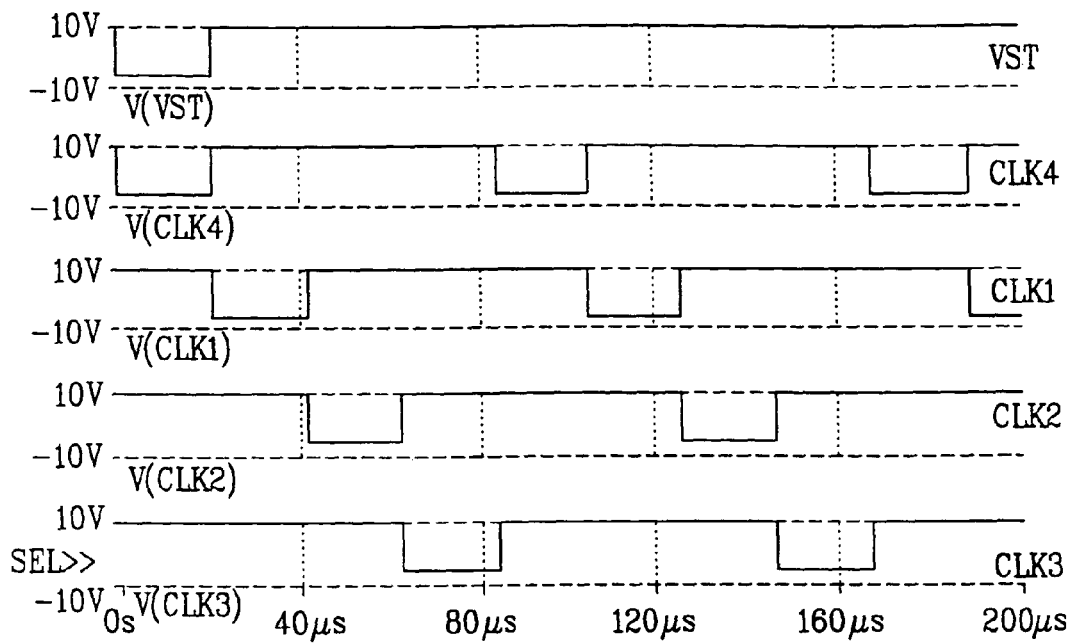
FIG. 5 illustrates forward input and output waveforms of the shift register of the LCD panel according to the first embodiment of the present invention.
Figure 5:
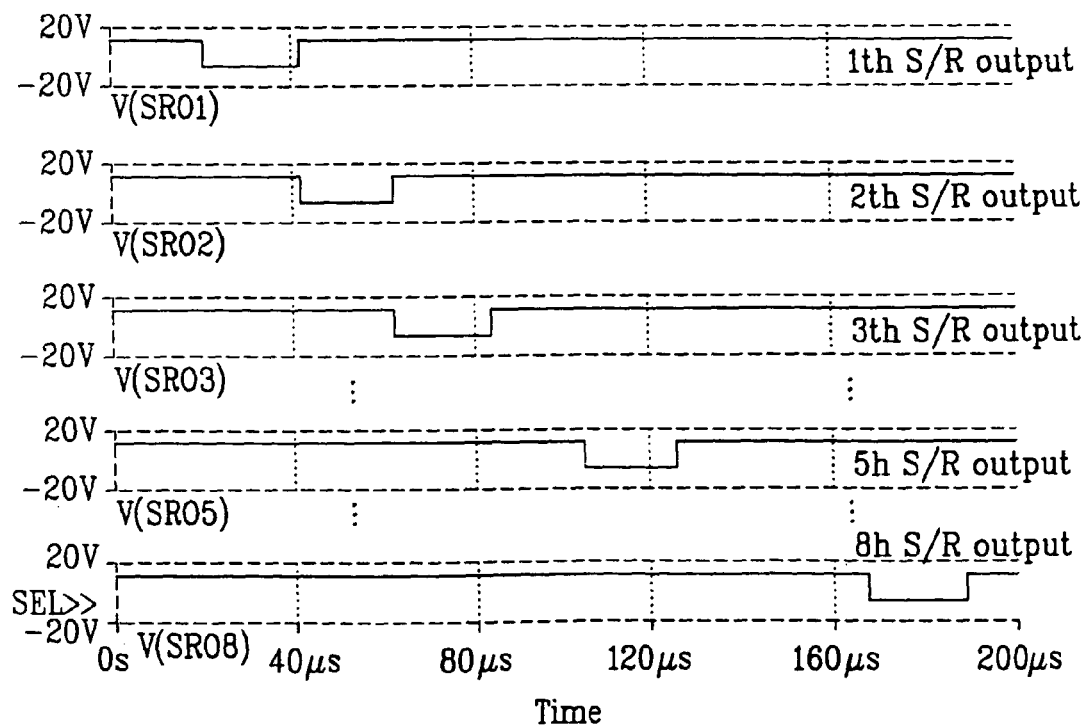

FIG. 5 illustrates forward input and output waveforms of the shift register of the LCD panel according to the first embodiment of the present invention. In addition, FIG. 6 illustrates backward input and output waveforms of the shift register of the LCD panel according to the first embodiment of the present invention.

First, in case of the forward driving, as shown in FIG. 5, the first clock signal CLK1, the second clock signal CLK2, the third clock signal CLK3 and the fourth clock signal CLK4 are sequentially input and repeated. In the same manner as the related art, when the start pulse is input the fourth clock signal is input.

Figure 6:
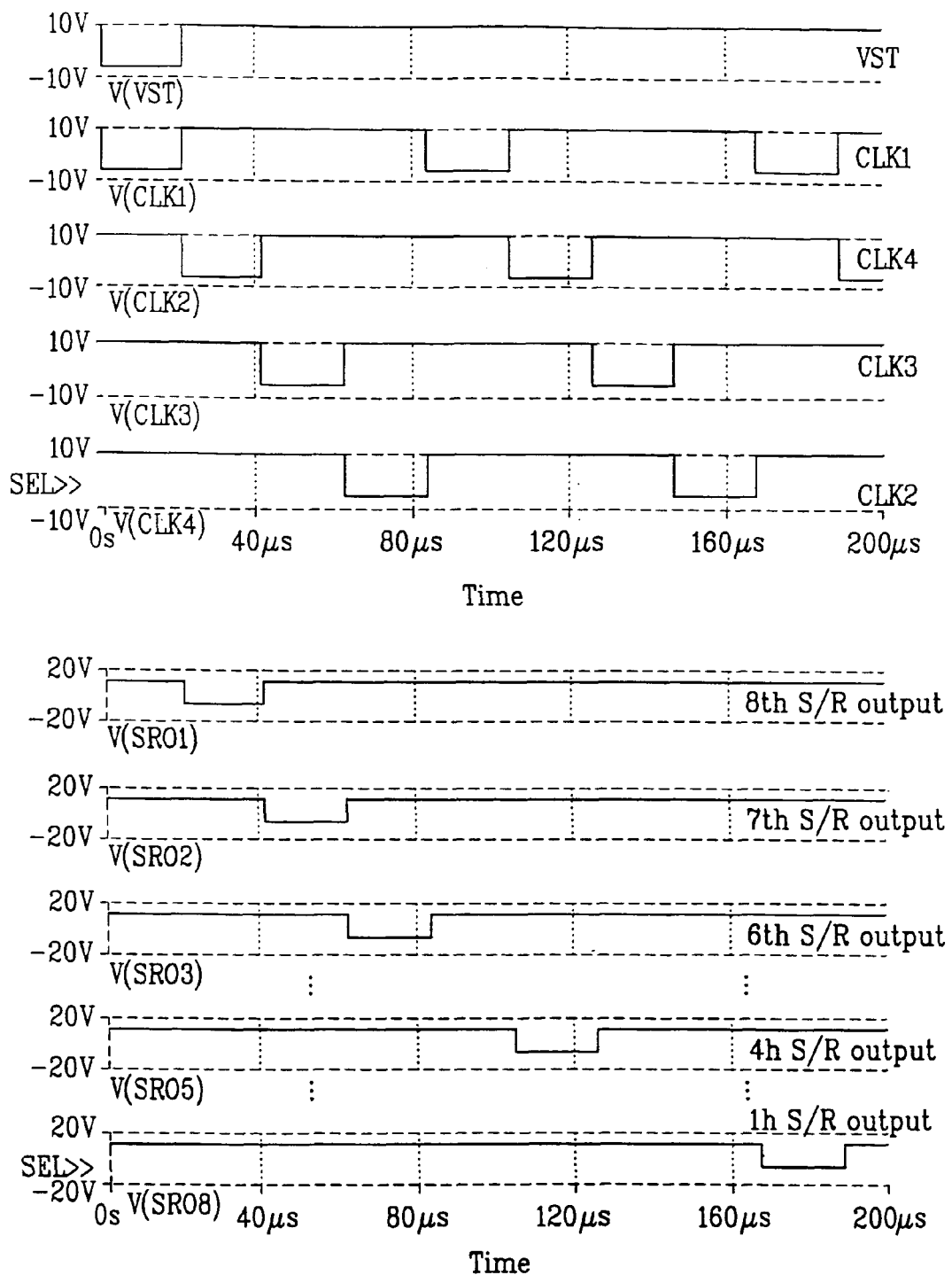
FIG. 6 illustrates backward input and output waveforms of the shift register of the LCD panel according to the first embodiment of the present invention.

In case of the backward driving, as shown in FIG. 6, the fourth clock signal CLK4, the third clock signal CLK3, the second clock signal CLK2 and the first clock signal CLK1 are sequentially input and repeated. When the start pulse is input, the first clock signal is input.

The forward operation of the first block will be described.

The first p-MOS transistor TFT1 is turned on when a low level start pulse VST is input in a switch-on state. At this time, since the fourth clock signal CLK4 is input in the switch on state, the second p-MOS transistor TFT2 is turned on. Accordingly, the node Q becomes low level in a switch on state. This turns on the sixth p-MOS transistor TFT6. As a result, the first clock signal CLK1 is output to the output terminal. In addition, during this sequence node QB is in a switch off state (high level). As a result, the seventh p-MOS transistor TFT7 is turned off and the Vss voltage is not applied to the output terminal.

Likewise, in the second block, because the output of the first block is low and the first clock signal is low, the sixth p-MOS transistor TFT6 is turned on. Accordingly, the second clock signal CLK2 applied to the source of the sixth p-MOS transistor TFT6 is output.

As shown in FIG. 5, the outputs are sequentially generated from the first block to the eighth block.

The backward operation of the first block will is described below.

For example, a low level start pulse VST is input in a switch-on state, and a low level first clock signal is input in a switch-on state. As a result of these inputs to the first block, the first p-MOS transistor TFT1 is turned on while the second p-MOS transistor TFT2 is not turned on and, the sixth p-MOS transistor TFT6 is not turned on, thereby failing to output the first clock signal. However, in the eighth block, since the first p-MOS transistor TFT1 and the ninth p-MOS transistor TFT9 are turned on at the same time, the sixth p-MOS transistor TFT6 is turned on, thereby outputting the fourth clock signal.

As described above, the output signal of the eighth block is first output. The signal output from the eighth block is applied to the eighth p-MOS transistor TFT8 of the seventh block. At this time, since the fourth clock signal CLK4 becomes low level in a switch-on state, the eighth and ninth p-MOS transistors TFT8 and TFT9 are turned on in the seventh block and the sixth p-MOS transistor is also turned on, thereby outputting the third clock signal. The start pulse is synchronized with the first clock signal, and the fourth to first clock signals are sequentially generated. Then, the signals are backward output in the order of the eighth block to the first block.

Since forward and backward scanning can be implemented without a separate signal or PIN, a panel suitable for system options can be provided. Namely, such a panel is applicable to both a landscape type display and a portrait type display orientations.

Figure 7:
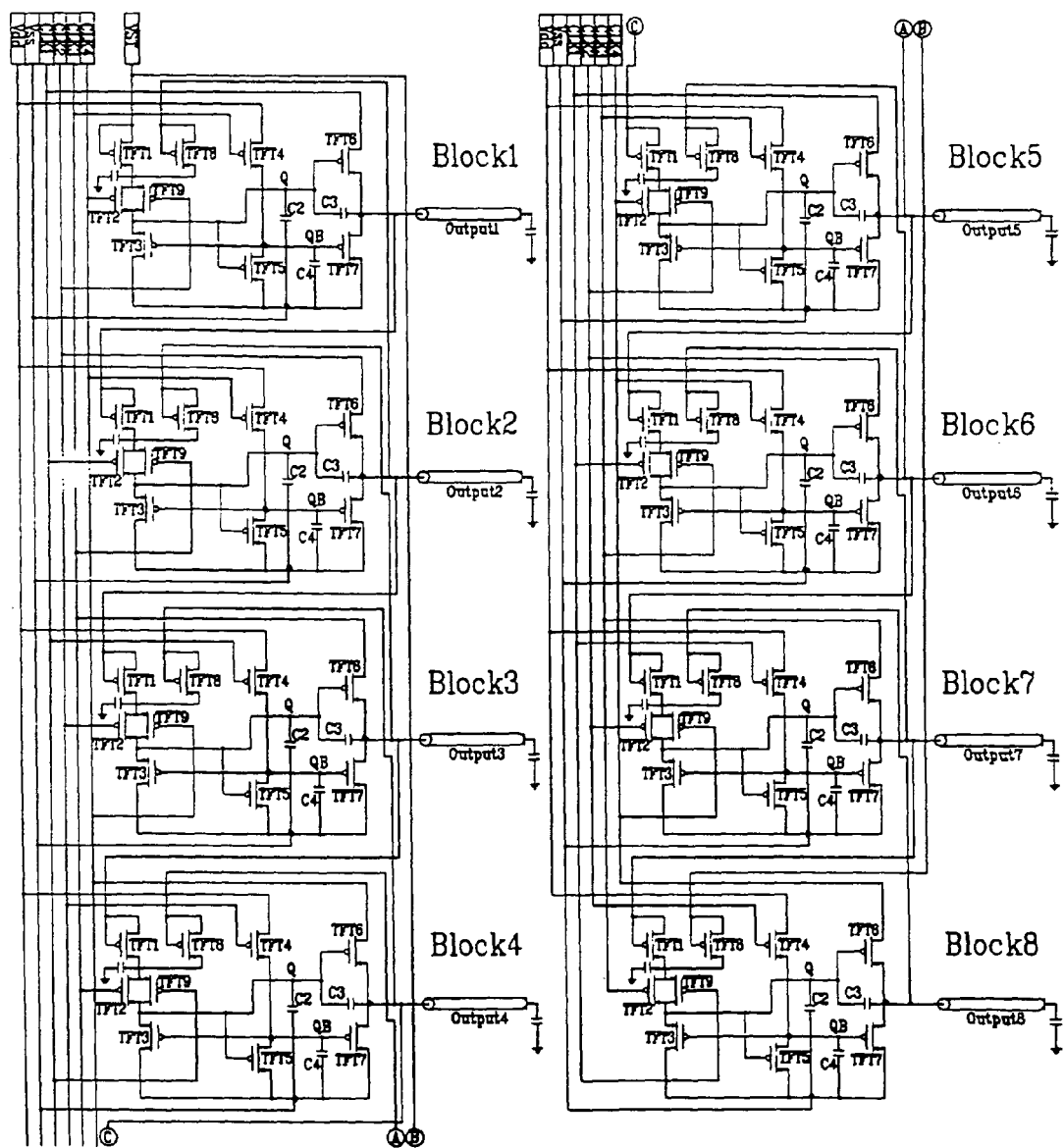
FIG. 7 is a circuit diagram of a shift register of an LCD panel according to a second embodiment of the present invention.

Meanwhile, a bi-directional driving circuit of the LCD panel according to a second embodiment of the present invention is shown in FIG. 7.

FIG. 7 illustrates the bi-directional driving circuit of the LCD panel according to the second embodiment of the present invention.

The bi-directional driving circuit of the LCD panel according to the second embodiment of the present invention is similar to the bi-directional driving circuit of the LCD panel according to the first embodiment. However, in the second embodiment of the present invention, unlike the first embodiment, the gate of the fifth p-MOS transistor TFT5 is connected to the drain terminals of the second p-MOS transistor TFT2 and the ninth p-MOS transistor TFT9. The operation of the bi-directional driving circuit of the LCD panel according to the second embodiment of the present invention is the same as that according to the first embodiment. Accordingly, its description will be omitted.

Figure 8:
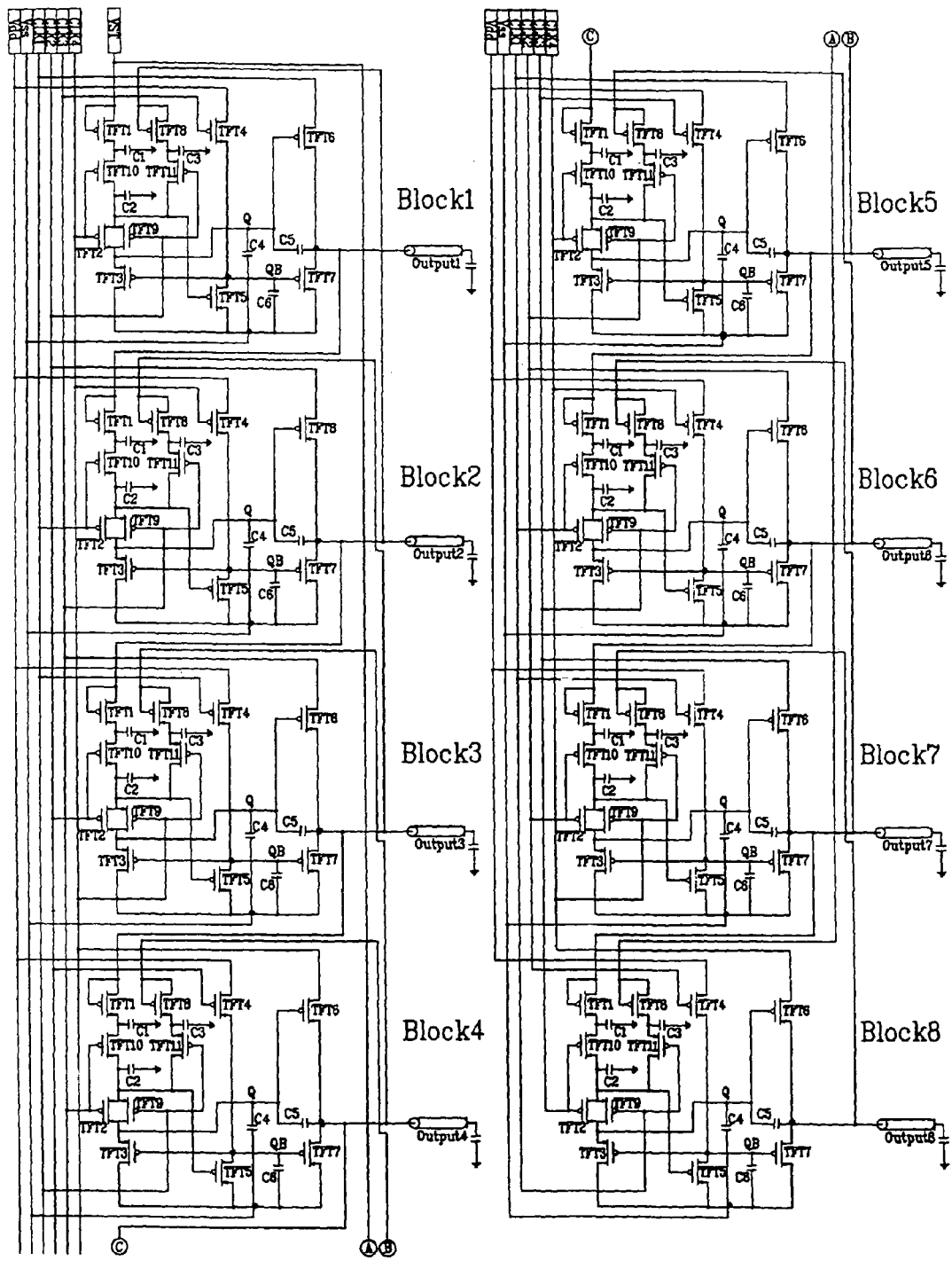
FIG. 8 is a circuit diagram of a shift register of an LCD panel according to a third embodiment of the present invention.

Also, a bi-directional driving circuit of the LCD panel according to a third embodiment of the present invention is shown in FIG. 8.

FIG. 8 illustrates the bi-directional driving circuit of the LCD panel according to the third embodiment of the present invention.

The bi-directional driving circuit of the LCD panel according to the third embodiment of the present invention includes the same elements as those of the bi-directional driving circuit of the LCD panel according to the first embodiment. The bi-directional driving circuit of the LCD panel according to the third embodiment further includes a tenth p-MOS transistor TFT10. TFT10 can be switched depending on the gate voltage of the second p-MOS transistor TFT2 between the first p-MOS transistor TFT1 and the second p-MOS transistor TFT2. An eleventh p-MOS transistor TFT11 can be switched depending on the gate voltage of the ninth p-MOS transistor TFT9 between the eighth p-MOS transistor TFT8 and the second p-MOS transistor TFT2.

In other words, the first block of the bi-directional driving circuit of the LCD panel according to the third embodiment of the present invention includes a first p-MOS transistor TFT1 having a source and a gate to which the start pulse VST is applied. The second p-MOS transistor TFT2 has a gate to which the fourth clock signal CLK4 is applied. The third p-MOS transistor TFT3 has a source connected to a drain of the second p-MOS transistor TFT2 and a drain connected to the Vss terminal. The fourth p-MOS transistor TFT4 has a source connected to the Vdd terminal, a gate connected to the third clock signal CLK3, and a drain connected to a gate of the third p-MOS transistor TFT3. The fifth p-MOS transistor TFT5 has a source connected to the drain of the fourth p-MOS transistor TFT4, and a gate connected to the drain of the first p-MOS transistor TFT1, and a drain connected to the Vss terminal. The sixth p-MOS transistor TFT6 has a source connected to the first clock signal CLK1, a gate connected to the drain of the second p-MOS transistor TFT2, and a drain connected to the output terminal. The seventh p-MOS transistor TFT7 has a source connected to the output terminal, a gate connected to the drain of the fourth p-MOS transistor TFT4, and a drain connected to the Vss terminal. The eighth p-MOS transistor TFT8 has a source and a gate connected to an output terminal of the next block (second block). The ninth p-MOS transistor TFT9 is connected to the second p-MOS transistor TFT2 in parallel, having a gate connected to the second clock signal. The tenth p-MOS transistor TFT10 has a source connected to the drain of the first p-MOS transistor TFT1 and a gate and a drain respectively connected to the source and the gate of the second p-MOS transistor TFT2. The eleventh p-MOS transistor TFT11 has a source connected to the drain of the eighth p-MOS transistor TFT8, a drain connected to the source of the second p-MOS transistor TFT2 and the gate of the fifth p-MOS transistor TFT5, and a gate connected to the gate of the ninth p-MOS transistor TFT9.

Contact nodes between the first p-MOS transistor TFT1 and the tenth p-MOS transistor TFT10 and between the tenth p-MOS transistor and the second p-MOS transistor TFT2 are grounded through the first and second capacitors C1 and C2. A contact node between the eighth and eleventh p-MOS transistors are grounded through the third capacitor C3. The gate of the sixth p-MOS transistor TFT6 is connected to the Vss terminal through the fourth capacitor C4, and the gate and drain are connected with each other through the fifth capacitor C5. The gate of the seventh p-MOS transistor TFT7 is connected to the Vss terminal through the sixth capacitor C6.

The clock signals from the first block to the eighth block are connected in the same manner as the first embodiment of the present invention.

In other words, the first clock signal CLK1 is applied to the source of the sixth p-MOS transistor TFT6 in the first and fifth blocks. The second clock signal CLK2 is applied to the source of the sixth p-MOS transistor TFT6 in the second and sixth blocks. The third clock signal CLK3 is applied to the source of the sixth p-MOS transistor TFT6 in the third and seventh blocks. The fourth clock signal CLK4 is applied to the source of the sixth p-MOS transistor TFT6 in the fourth and eighth blocks.

The third clock signal CLK3 is applied to the gate of the fourth p-MOS transistor TFT4 in the first and fifth blocks. The fourth clock signal CLK4 is applied to the gate of the fourth p-MOS transistor TFT4 in the second and sixth blocks. The first clock signal CLK1 is applied to the gate of the fourth p-MOS transistor TFT4 in the third and seventh blocks. The second clock signal CLK2 is applied to the gate of the fourth p-MOS transistor TFT4 in the fourth and eighth blocks.

The fourth clock signal CLK4 is applied to the gate of the second p-MOS transistor TFT2 in the first and fifth blocks. The first clock signal CLK1 is applied to the gate of the second p-MOS transistor TFT2 in the second and sixth blocks. The second clock signal CLK2 is applied to the gate of the second p-MOS transistor TFT2 in the third and seventh blocks. The third clock signal CLK3 is applied to the gate of the second p-MOS transistor TFT2 in the fourth and eighth blocks.

The second clock signal CLK2 is applied to the gate of the ninth p-MOS transistor TFT9 in the first and fifth blocks. The third clock signal CLK3 is applied to the gate of the ninth p-MOS transistor TFT9 in the second and sixth blocks. The fourth clock signal CLK4 is applied to the gate of the ninth p-MOS transistor TFT9 in the third and seventh blocks. The first clock signal CLK1 is applied to the gate of the ninth p-MOS transistor TFT9 in the fourth and eighth blocks.

Figure 9:
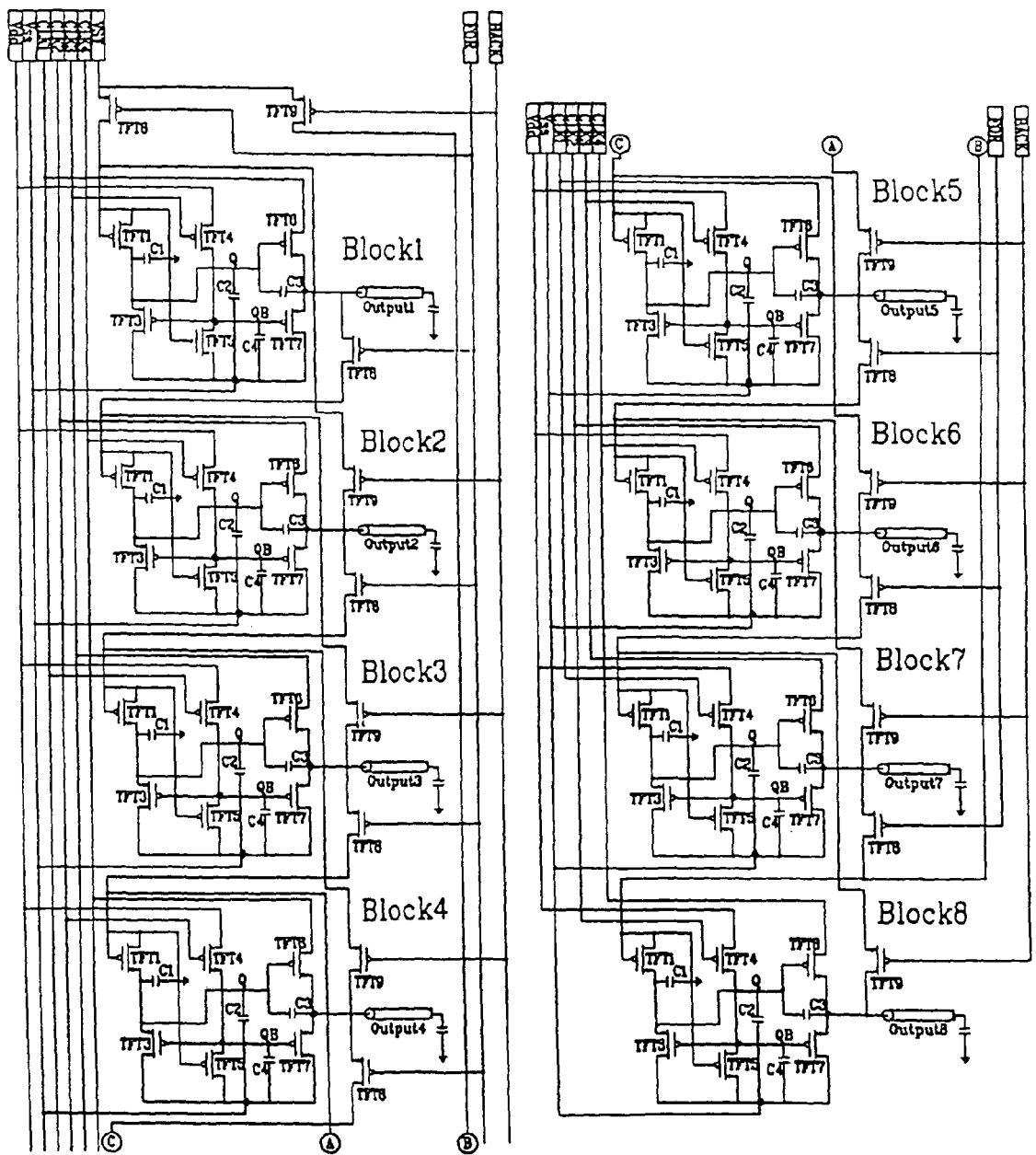
FIG. 9 is a circuit diagram of a shift register of an LCD panel according to a fourth embodiment of the present invention.

A bi-directional driving circuit of the LCD panel according to a fourth embodiment of the present invention is as shown in FIG. 9.

FIG. 9 illustrates the bi-directional driving circuit of the LCD panel according to the fourth embodiment of the present invention.

In the bi-directional driving circuit of the LCD panel according to the fourth embodiment of the present invention, the start pulse is switched so as to be applied to the first p-MOS transistor of the first block or the last block. The output signal of each block is switched so as to be applied to the first p-MOS transistor of a previous block of each block or its next block. Thus, forward scanning and backward scanning can be controlled. The clock signal input to the sixth p-MOS transistor TFT6 is output without using the second p-MOS transistor TFT2 when the start pulse is switched on.

Figure 1:
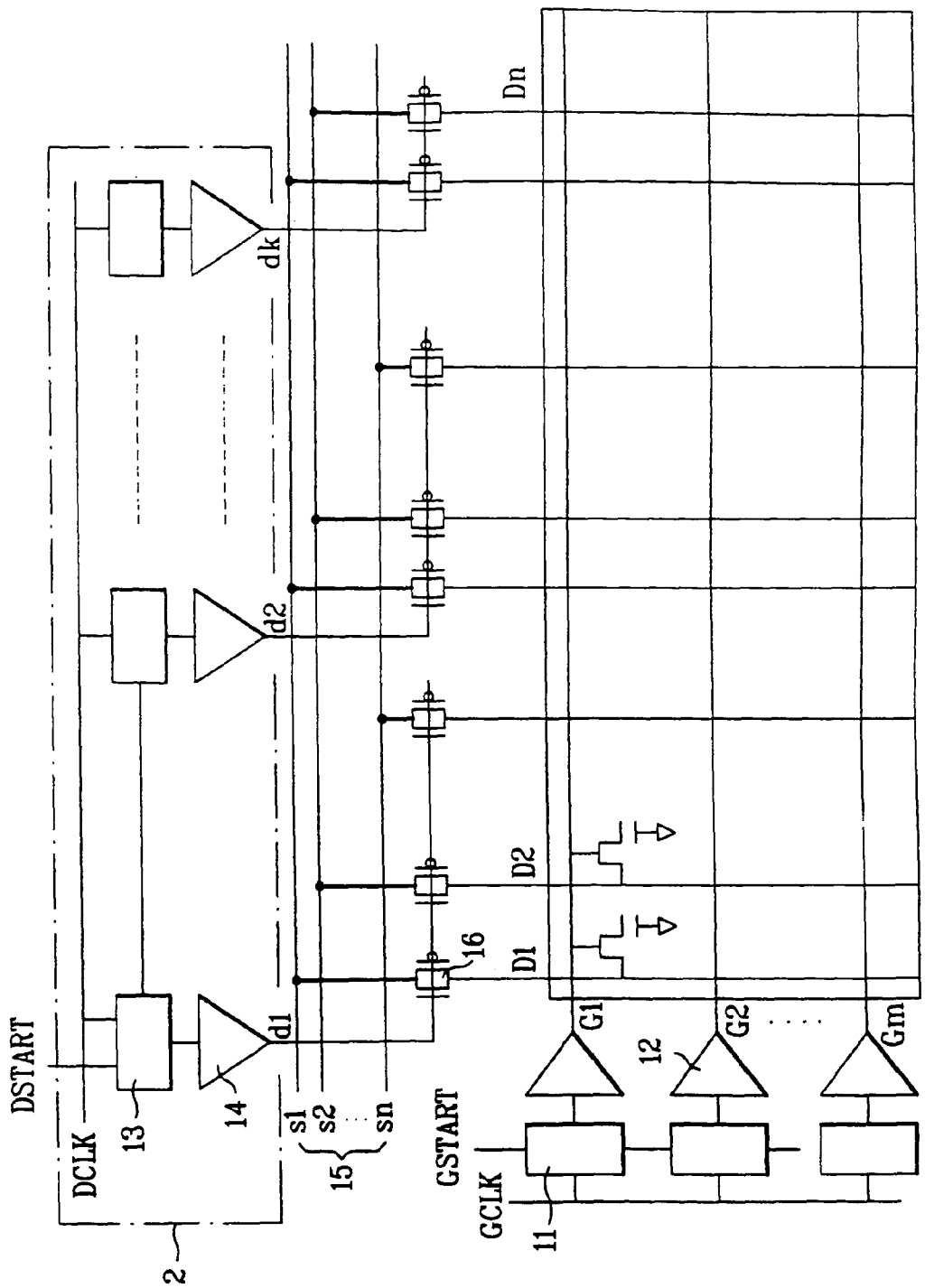
FIG. 1 is a circuit diagram of a related art liquid crystal display (LCD) panel.
Figure 2:
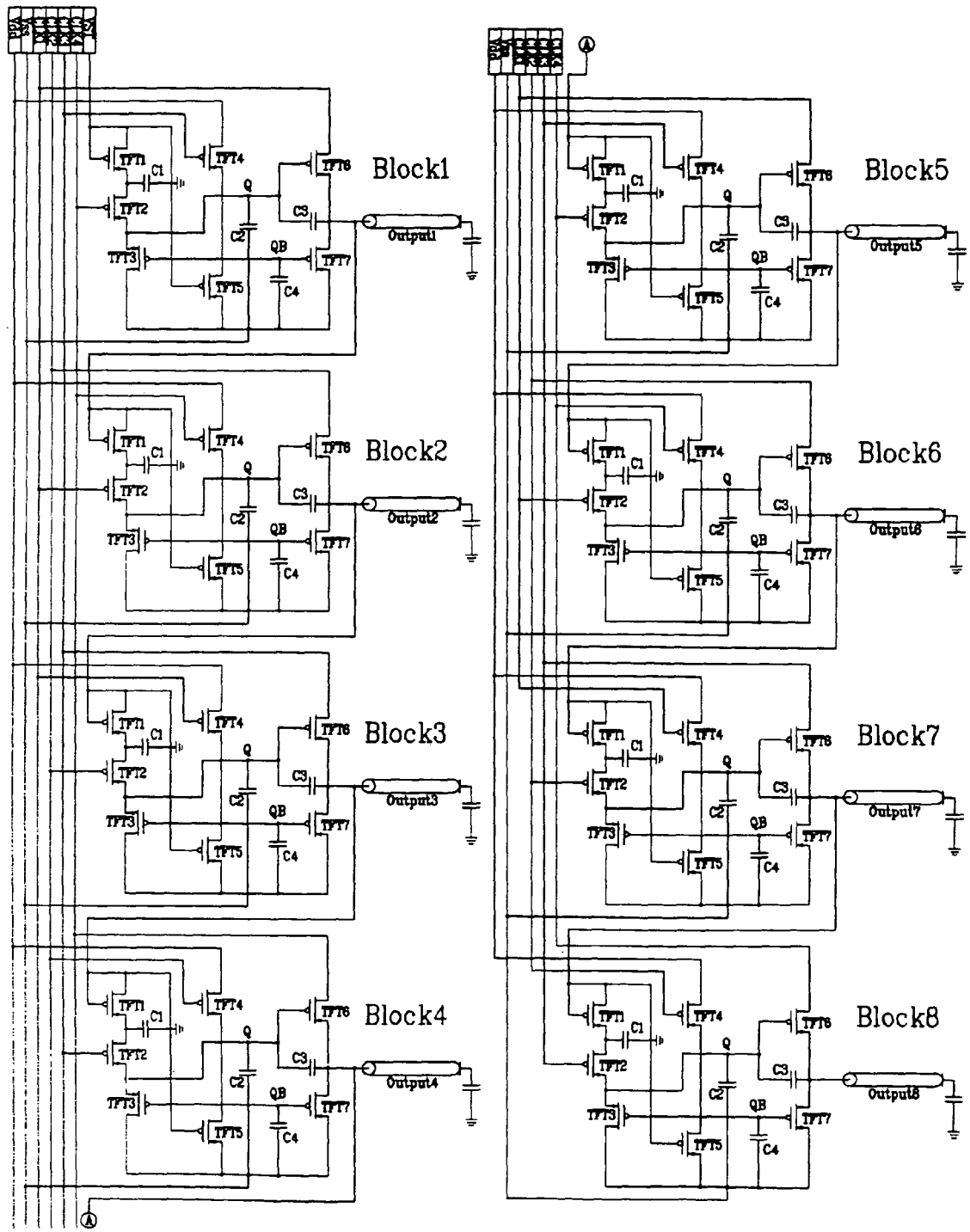
FIG. 2 is a circuit diagram of a shift register of a related art LCD panel.
Figure 3:
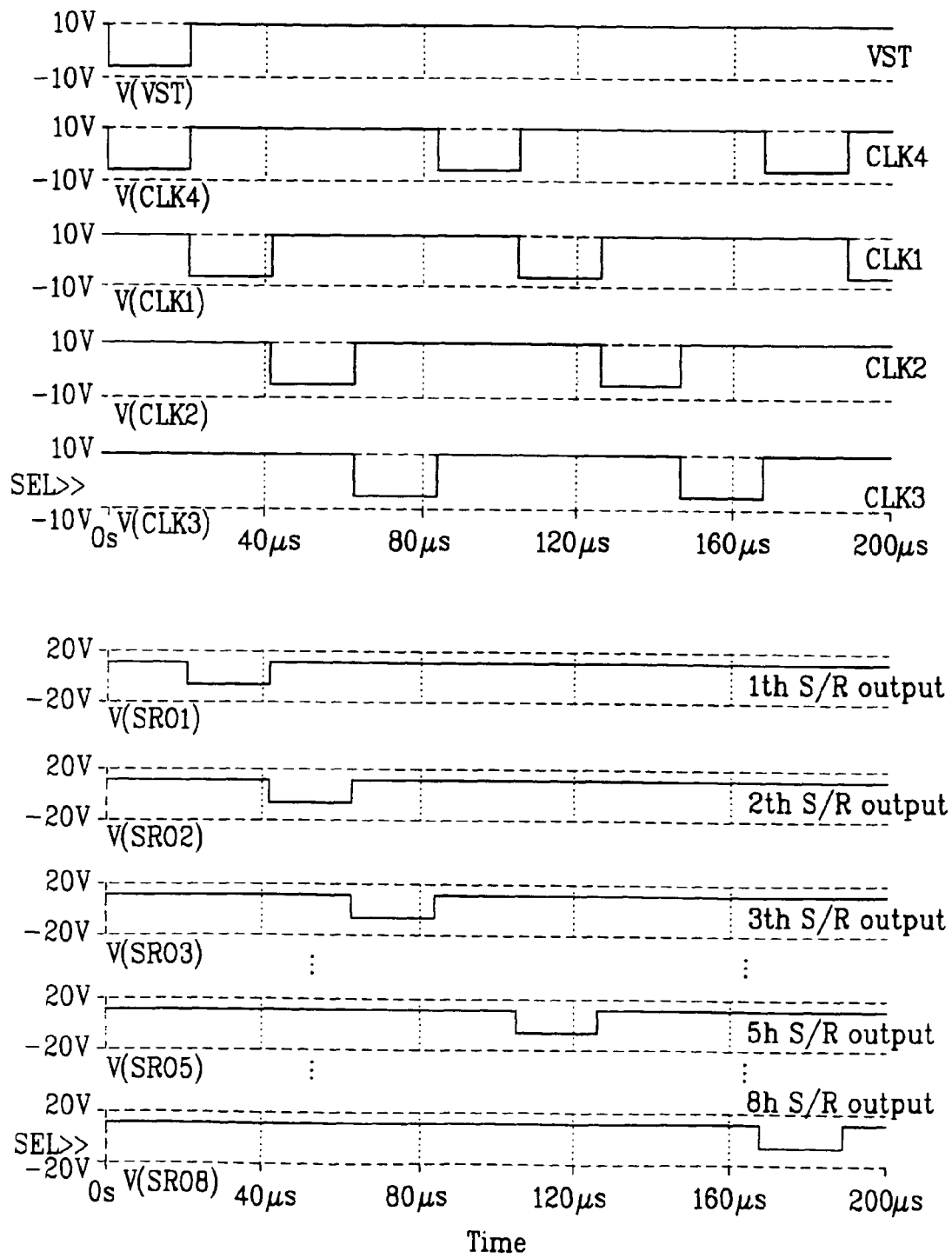
FIG. 3 illustrates input and output waveforms of the shift register of the related art LCD panel.

The bi-directional driving circuit of the LCD panel according to the fourth embodiment of the present invention includes the same elements as those of the related art driving circuit of the LCD panel shown in FIG. 2, except that the second p-MOS transistor TFT2 between the first p-MOS transistor TFT1 and the third p-MOS transistor TFT3 is omitted. The bi-directional driving circuit of the LCD panel according to the fourth embodiment further includes a plurality of eighth p-MOS transistors TFT8 for switching the start pulse VST applied to the gate and the source of the first p-MOS transistor TFT1 in the first block and for switching the output signal applied to the gate and the source of the first p-MOS transistor TFT1 in the next block through an external forward control signal and a plurality of ninth p-MOS transistors TFT9 for switching the start pulse VST applied to the gate and the source of the first p-MOS transistor TFT1 in the last block and for switching the output signal applied to the gate and the source of the first p-MOS transistor TFT1 in the previous block through an external backward control signal.

In other words, the first block of the bi-directional driving circuit of the LCD panel according to the fourth embodiment of the present invention includes a first p-MOS transistor TFT1 having a source and a gate to which the start pulse VST is applied. The third p-MOS transistor TFT3 has a source connected to a drain of the first p-MOS transistor TFT1 and a drain connected to the Vss terminal. The fourth p-MOS transistor TFT4 has a source connected to the Vdd terminal, a gate connected to the third clock signal CLK3, and a drain connected to a gate of the third p-MOS transistor TFT3. The fifth p-MOS transistor TFT5 has a source connected to the drain of the fourth p-MOS transistor TFT4, and a gate connected to the source of the first p-MOS transistor TFT1, and a drain connected to the Vss terminal. The sixth p-MOS transistor TFT6 has a source connected to the first clock signal CLK1, a gate connected to the drain of the first p-MOS transistor TFT1, and a drain connected to the output terminal. The seventh p-MOS transistor TFT7 has a source connected to the output terminal, a gate connected to the drain of the fourth p-MOS transistor TFT4, and a drain connected to the Vss terminal. The bi-directional driving circuit of the forth embodiment also includes a plurality of eighth p-MOS transistors TFT8 for switching the start pulse VST applied to the gate and the source of the first p-MOS transistor TFT1 in the first block and for switching the output signal applied to the gate and the source of the first p-MOS transistor TFT1 in the next block through an external forward control signal, and a plurality of ninth p-MOS transistors TFT9 for switching the start pulse VST applied to the gate and the source of the first p-MOS transistor TFT1 in the last block for switching the output signal applied to the gate and the source of the first p-MOS transistor TFT1 in the previous block through an external backward control signal.

A contact node between the first p-MOS transistor TFT1 and the third p-MOS transistor TFT3 is grounded through the first capacitor C1. The gate of the sixth p-MOS transistor TFT6 is connected to the Vss terminal through the second capacitor C2, and its gate and drain are connected with each other through the third capacitor C3. The gate of the seventh p-MOS transistor TFT7 is connected to the Vss terminal through the fourth capacitor C4.

The clock signals from the first block to the eighth block are connected in the same manner as the first embodiment of the present invention.

In other words, the first clock signal CLK1 is applied to the source of the sixth p-MOS transistor TFT6 in the first and fifth blocks. The second clock signal CLK2 is applied to the source of the sixth p-MOS transistor TFT6 in the second and sixth blocks. The third clock signal CLK3 is applied to the source of the sixth p-MOS transistor TFT6 in the third and seventh blocks. The fourth clock signal CLK4 is applied to the source of the sixth p-MOS transistor TFT6 in the fourth and eighth blocks.

The third clock signal CLK3 is applied to the gate of the fourth p-MOS transistor TFT4 in the first and fifth blocks. The fourth clock signal CLK4 is applied to the gate of the fourth p-MOS transistor TFT4 in the second and sixth blocks. The first clock signal CLK1 is applied to the gate of the fourth p-MOS transistor TFT4 in the third and seventh blocks. The second clock signal CLK2 is applied to the gate of the fourth p-MOS transistor TFT4 in the fourth and eighth blocks.

The operation of the aforementioned bi-directional driving circuit of the LCD panel according to the fourth embodiment of the present invention will be described below.

When the forward control signal is input in a switch-on state (low level) and a backward control signal is input in a switch-off state (high level), the eighth p-MOS transistor TFT8 is turned on and the ninth p-MOS transistor TFT9 is turned off. Accordingly, since the start pulse VST is input to the first p-MOS transistor TFT1 of the first block and the output signal of each block is input to the first p-MOS transistor TFT1 of the next block, the first p-MOS transistor TFT1 of the first block is turned on and the sixth p-MOS transistor TFT6 is also turned on. As a result, the first clock signal CLK1 applied to the source of the sixth p-MOS transistor TFT6 is output to the output terminal and the signal output from the first output terminal is input to the first p-MOS transistor TFT1 of the second block. By the above operation, the shift register is forward operated from the first block to the last block.

On the contrary, if the forward control signal is input in a switch-off state (high level) and the backward control signal is input in a switch-on state (low level), the eighth p-MOS transistor TFT8 is turned off and the ninth p-MOS transistor TFT9 is turned on. Since the start pulse VST is input to the first p-MOS transistor TFT1 of the last block and the output signal of each block is input to the first p-MOS transistor TFT1 of the previous block, the first p-MOS transistor TFT1 of the last block is turned on and the sixth p-MOS transistor TFT6 of the last block is also turned on. As a result, the fourth clock signal CLK4 applied to the source of the sixth p-MOS transistor TFT6 is output to the output terminal and the signal output from the output terminal of the last block is input to the first p-MOS transistor TFT1 of the previous block. By the above operation, the shift register is backward operated from the last block to the first block.

As another embodiment, in the driving circuit of the LCD panel according to the fourth embodiment of the present invention, the second p-MOS transistor TFT2 may be provided in the same manner as the related art LCD panel of FIG. 2. In this case, the above operation can be implemented as well.

As described above, the bi-directional driving circuit of the LCD panel according to the present invention has the following advantages.

A separate switching element is provided so that the start signal is input to the first block or the last block. Also, the phase of the clock signal is changed so that the shift register is bi-directionally operated. Thus, the LCD panel can be driven bi-directionally. In this case, system makers can drive the LCD panel having the driving circuit by changing arrangement of the panel to adapt to their design option.

Furthermore, the LCD panel can be driven bi-directionally without a separate input pin.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A bi-directional driving circuit of a liquid crystal display (LCD) panel having a plurality of blocks, each block outputting a signal, the bi-directional driving circuit comprising:
   a first switching element having a source and a gate for receiving one of a start pulse and an output signal of a previous block;
   a second switching element having a source connected to a drain of the first switching element and a gate for receiving a first clock signal;
   a third switching element having a source directly connected to a drain of the second switching element and a drain directly connected to a ground terminal Vss;
   a fourth switching element having a source connected to a power source voltage terminal Vdd, a gate connected to a second clock signal, and a drain connected to a gate of the third switching element;
   a fifth switching element having a source connected to the drain of the fourth switching element, a gate connected to the drain of the first switching element, and a drain connected to the Vss terminal;
   a sixth switching element having a source connected to a third clock signal, a gate connected to the drain of the second switching element, and a drain connected to an output terminal;
   a seventh switching element having a source connected to the output terminal, a gate connected to the drain of the fourth switching element, and a drain connected to the Vss terminal;
   an eighth switching element having a source and a gate for receiving one of the start pulse and an output terminal of a next block and a drain connected to the drain of the first switching element; and
   a ninth switching element connected to the second switching element in parallel, having a gate connected to a third clock signal.

* * * * *